United States Patent
Leicht et al.

(10) Patent No.: US 9,365,925 B2
(45) Date of Patent: Jun. 14, 2016

(54) MULTILAYER STRUCTURED COATINGS FOR CUTTING TOOLS

(71) Applicant: Kennametal Inc., Latrobe, PA (US)

(72) Inventors: Peter Rudolf Leicht, Latrobe, PA (US); Zhenyu Liu, Greensburg, PA (US); Mark S Greenfield, Greensburg, PA (US); Yixiong Liu, Greenburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 0 days.

(21) Appl. No.: 14/226,999

(22) Filed: Mar. 27, 2014

(65) Prior Publication Data
US 2014/0291036 A1    Oct. 2, 2014

Related U.S. Application Data

(60) Provisional application No. 61/806,035, filed on Mar. 28, 2013.

(51) Int. Cl.
| | |
|---|---|
| *C23C 16/40* | (2006.01) |
| *C23C 16/06* | (2006.01) |
| *C23C 16/30* | (2006.01) |
| *C23C 28/04* | (2006.01) |
| *C23C 28/00* | (2006.01) |

(52) U.S. Cl.
CPC ............... *C23C 16/06* (2013.01); *C23C 16/30* (2013.01); *C23C 16/403* (2013.01); *C23C 28/042* (2013.01); *C23C 28/044* (2013.01); *C23C 28/42* (2013.01)

(58) Field of Classification Search
USPC ............ 51/307, 309; 428/216, 325, 336, 697, 428/698, 699, 701, 702
See application file for complete search history.

(56) References Cited

U.S. PATENT DOCUMENTS

| | | | |
|---|---|---|---|
| 5,700,569 A * | 12/1997 | Ruppi | 428/336 |
| 6,333,099 B1 * | 12/2001 | Strondl et al. | 428/698 |
| 6,436,519 B2 * | 8/2002 | Holzschuh | 428/701 |
| 7,153,562 B2 * | 12/2006 | Rodmar et al. | 428/216 |
| 7,887,935 B2 | 2/2011 | Elkouby et al. | |
| 8,119,227 B2 * | 2/2012 | Reineck et al. | 428/697 |
| 2002/0176755 A1 | 11/2002 | Ruppi | |
| 2003/0108752 A1 | 6/2003 | König et al. | |

(Continued)

FOREIGN PATENT DOCUMENTS

WO   2006/072288   *   7/2006

OTHER PUBLICATIONS 07-11-2014-K-4300USWO1-PCT_Search_Report_and_Written_Opinion.

(Continued)

*Primary Examiner* — Archene Turner
(74) *Attorney, Agent, or Firm* — Larry R. Meenan

(57) ABSTRACT

In one aspect, cutting tools are described having coatings adhered thereto which, in some embodiments, can demonstrate desirable wear resistance and increased cutting lifetimes. A coated cutting tool described herein comprises a substrate and a coating adhered to the substrate, the coating having a multilayer structure including a plurality of structural units each comprising a bonding layer and an adjacent alumina layer, the alumina layer having a thickness of less than 0.5 μm and the bonding layer having a thickness less than 1 μm, the bonding layer comprising TiCN and TiAlOC.

20 Claims, 5 Drawing Sheets

(56) References Cited

U.S. PATENT DOCUMENTS

2003/0143384 A1 7/2003 Ruppi et al.
2004/0180241 A1 9/2004 Rodmar et al.
2008/0050614 A1* 2/2008 Holzschuh .................... 428/698

OTHER PUBLICATIONS

PCT/US2014/031977—International Report Patentability.

* cited by examiner

MULTILAYER STRUCTURED COATINGS FOR CUTTING TOOLS

RELATED APPLICATION DATA

The present application claims priority pursuant to 35 U.S.C. §119(e) to U.S. Provisional Patent Application Ser. No. 61/806,035 filed Mar. 28, 2013, which is hereby incorporated by reference in its entirety.

FIELD

The present invention relates to coatings for cutting tools and, in particular, to coatings deposited by chemical vapor deposition (CVD).

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multilayer constructions of the foregoing refractory materials have increasingly reached their performance limits, thereby calling for the development of new coating architectures for cutting tools.

SUMMARY

In one aspect, cutting tools are described having coatings adhered thereto which, in some embodiments, can demonstrate desirable wear resistance and increased cutting lifetimes. A coated cutting tool described herein comprises a substrate and a coating adhered to the substrate, the coating having a multilayer structure including a plurality of structural units each comprising a bonding layer and an adjacent alumina layer, the alumina layer having a thickness of less than 0.5 µm and the bonding layer having a thickness less than 1 µm, the bonding layer comprising TiCN and TiAlOC. In some embodiments, the bonding layer further comprises TiOCN. Further, structural units can be adjacent to one another forming a structure of alternating alumina and bonding layers.

Methods of making coated cutting tools are also provided. A method of making a coated cutting tool described herein comprises providing a cutting tool substrate and depositing over a surface of the cutting tool substrate by chemical vapor deposition a coating having a multilayer structure including a plurality of structural units each comprising a bonding layer and an adjacent alumina layer, the alumina layer having a thickness less than 0.5 µm and the bonding layer having a thickness less than 1 µm, the bonding layer comprising TiCN and TiAlOC. In some embodiments, the bonding layer further comprises TiOCN.

These and other embodiments are described in greater detail in the detailed description which follows.

DETAILED DESCRIPTION

Figure 1:
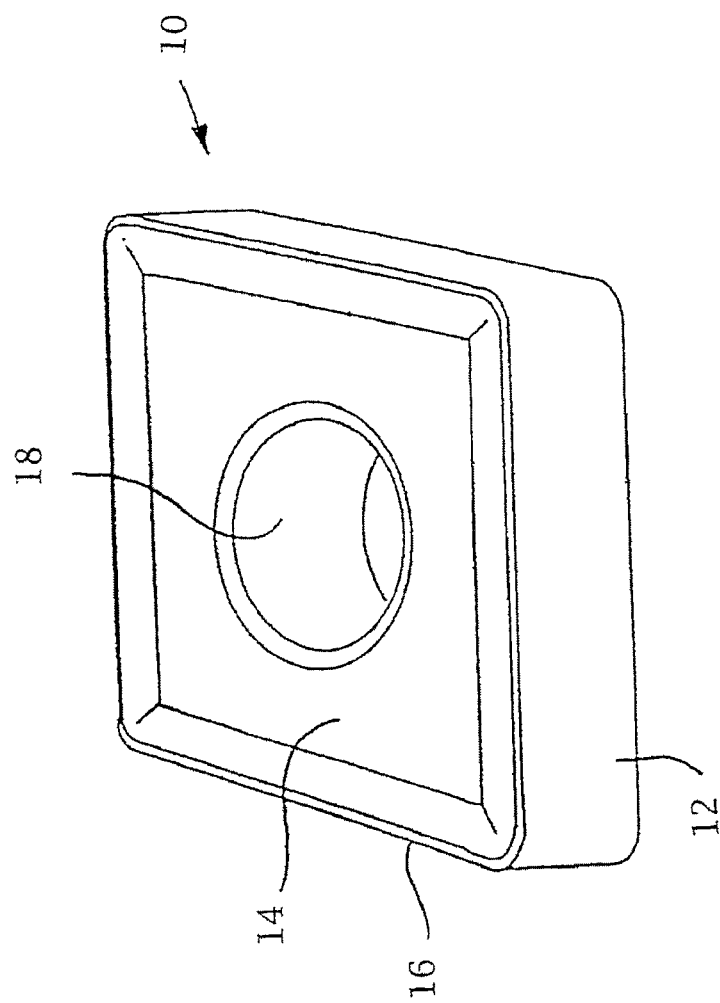
FIG. 1 illustrates a substrate of a coated cutting tool according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, cutting tools are described having coatings adhered thereto which, in some embodiments, can demonstrate desirable wear resistance and increased cutting lifetimes. A coated cutting tool described herein comprises a substrate and a coating adhered to the substrate, the coating having a multilayer structure including a plurality of structural units each comprising a bonding layer and an adjacent alumina layer, the alumina layer having a thickness of less than 0.5 µm and the bonding layer having a thickness less than 1 µm, the bonding layer comprising TiCN and TiAlOC. In some embodiments, the bonding layer further comprises TiOCN.

Turning now to specific components, a coated cutting tool described herein comprises a substrate. Substrates of coated cutting tools can comprise any material not inconsistent with the objectives of the present invention. In some embodiments, a substrate comprises cemented carbide, carbide, ceramic, cermet or steel.

A cemented carbide substrate can comprise tungsten carbide (WC). WC can be present in a substrate in an amount of at least about 70 weight percent. In some embodiments, WC is present in a substrate in an amount of at least about 80 weight percent or in an amount of at least about 85 weight percent. Additionally, metallic binder of a cemented carbide substrate can comprise cobalt or cobalt alloy. Cobalt, for example, can be present in a cemented carbide substrate in an amount ranging from about 3 weight percent to about 15 weight percent. In some embodiments, cobalt is present in a cemented carbide substrate in an amount of 5-12 weight percent or 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC in the substrate. The substrate, in some embodiments, comprises one or more solid solution carbides in an amount ranging from about 0.1 weight percent to about 5 weight percent. Additionally, a cemented carbide substrate can comprise nitrogen.

A substrate, in other embodiments, comprises polycrystalline cubic boron nitride (PcBN). PcBN substrates can include any amount of PcBN not inconsistent with the objectives of the present invention. For example, PcBN substrates can comprise greater than 85 weight percent PcBN. In some embodiments, a cutting tool substrate described herein comprises PcBN in an amount selected from Table I.

TABLE I

Weight Percent PcBN of Cutting Tool Substrate
Substrate Wt. % PcBN

| |
| --- |
| ≥60 |
| ≥70 |
| >80 |
| >85 |
| ≥90 |
| 70-95 |
| 86-97 |
| 90-97 |
| 92-95 |

Further, PcBN substrates of cutting tools described herein can also comprise ceramic or metallic binder. Suitable ceramic binders for PcBN substrates can comprise nitrides, carbonitrides, carbides, oxides and/or borides of titanium, tungsten, cobalt or aluminum. In some embodiments, for example, a PcBN substrate comprises a binder of AlN, $AlB_2$ or mixtures thereof. Moreover, in some embodiments, a binder comprises solid solutions of any of the foregoing ceramic or metallic binders.

PcBN substrates having compositional parameters described herein can be provided in various constructions. For example, a coated cutting tool can comprise a stand-alone monolithic solid piece PcBN substrate. Alternatively, a PcBN substrate is provided as a compact or insert attached to a support by brazing or other joining technique. Further, a PcBN substrate can be a full top or full top/full bottom cutting insert on a support.

In some embodiments, a substrate of a coated cutting tool described herein comprises one or more cutting edges formed at the juncture of a rake face and flank faces of the substrate. FIG. 1 illustrates a substrate of a coated cutting tool according to one embodiment described herein. As illustrated in FIG. 1, the substrate (10) has cutting edges (12) formed at the junction of the substrate rake face (14) and flank faces (16). The substrate also comprises an aperture (18) operable to secure the substrate (10) to a tool holder.

In some embodiments, a substrate of a coated cutting tool is an insert, drill bit, saw blade or other cutting apparatus.

A coating adhered to the substrate comprises a multilayer structure including a plurality of structural units, each structural unit comprising a bonding layer and an adjacent alumina layer. A bonding layer of a structural unit comprises TiCN and TiAlOC. In some embodiments, a bonding layer further comprises TiOCN. TiCN, TiAlOC and TiOCN can be provided as sublayers of the bonding layer. Further, a bonding layer of structural unit generally has a thickness less than 1 μm. In some embodiments, a bonding layer has a thickness selected from Table II.

TABLE II

Bonding layer thickness (nm)
Bonding Layer Thickness (nm)

| |
| --- |
| 10-950 |
| 5-500 |
| 5-200 |
| 10-100 |

When one or more sublayers of TiCN, TiAlOC and/or TiOCN constitute a bonding layer, the sublayers can each have a thickness of 5-500 nm.

As described herein, a structural unit also comprises an alumina layer adjacent or contacting the bonding layer. The alumina layer has a thickness less than about 0.5 μm. In some embodiments, an alumina layer of a structural unit has a thickness selected from Table III.

TABLE III

Alumina layer thickness (nm)
Bonding Layer Thickness (nm)

| |
| --- |
| 5-500 |
| 5-450 |
| 5-200 |
| 10-100 |
| 5-50 |

Structural units comprising a bonding layer and adjacent alumina layer can be stacked or repeated any number of times to build coating thickness. For example, structural units can be deposited adjacent to one another. In such embodiments, a structure of alternating bonding and alumina layers is formed. Alternatively, at least two of the structural units are spaced apart by one or more intervening layers. An intervening layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. An intervening layer, for example, can comprise a nitride, carbonitride, oxide or boride of one or more metallic elements selected from the group consisting of aluminum and metallic elements of Groups IVB, VB and VIB of the Periodic Table.

Moreover, a structural unit can be deposited directly on the surface of the cutting tool substrate without the presence of any base layers. However, in some embodiments, one or more base layers of the coating reside between the substrate and structural units. A base layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. A base layer, for example, can be selected from the group consisting of titanium nitride (TiN), titanium carbonitride (TiCN) and titanium oxycarbonitride (TiOCN). In some embodiments, a multilayer arrangement is present comprising TiN, TiCN and/ or TiOCN. Further, a transition layer can exist between a base layer arrangement and a deposited alumina layer of the structural unit. In some embodiments, such a transition layer comprises TiAlOC.

A base layer can have any thickness not inconsistent with the objectives of the present invention. In some embodiments, a base layer has a thickness of 0.2-12 μm or 0.5-5 μm.

Further, a coating described herein can also comprise one or more outer layers over the structural units. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers deposited over the structural units comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of TiN, TiCN and TiOCN. Outer layers of coatings described herein can have any thickness not inconsistent with the objectives of the present invention. An outer layer of a coating, in some embodiments, can have a thickness ranging from 0.5 µm to 5 µm.

With all components accounted for, a coating described herein can have a thickness up to 25 µm. A coating, for example, can have a total thickness of 2-15 µm or 5-12 µm.

Figure 2:
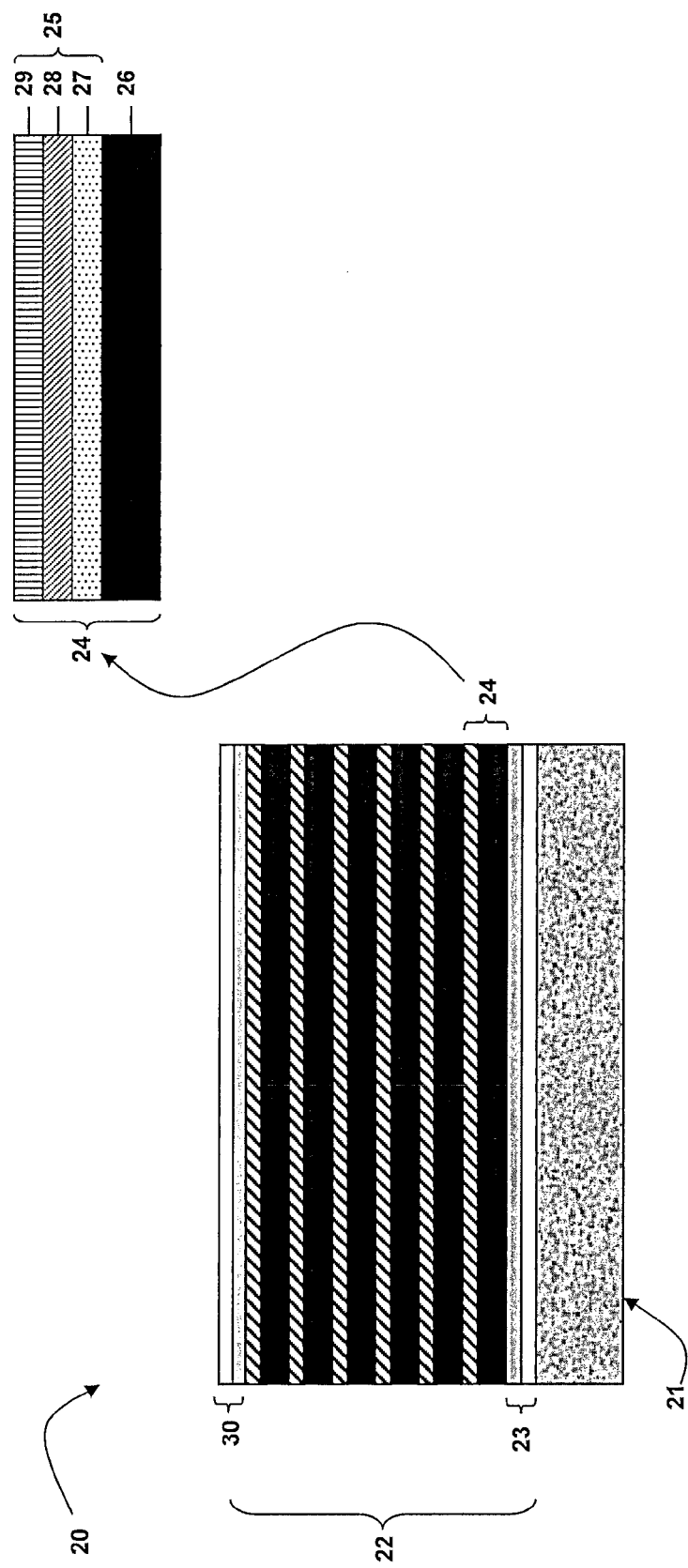
FIG. 2 is a schematic of a coated cutting tool according to one embodiment described herein.

FIG. 2 is a schematic of a coated cutting tool according to one embodiment described herein. As illustrated in FIG. 2, the coated cutting tool (20) comprises a substrate (21) and a coating (22) deposited by CVD adhered to the substrate. The CVD coating (22) comprises base layer construction (23) of TiN and TiCN. In some embodiments, the base layer construction (23) comprises TiN—TiCN/TiOCN. Structural units (24) each comprising a bonding layer (25) and adjacent alumina layer (26) are deposited over the base layer construction (23). As described herein, a bonding layer can comprise sublayers of TiAlOC (27), TiCN (28) and TiOCN (29). An outer layer (30) of TiCN/TiN or TiCN/TiOCN is deposited over the repeating structural units (24).

Figure 3:
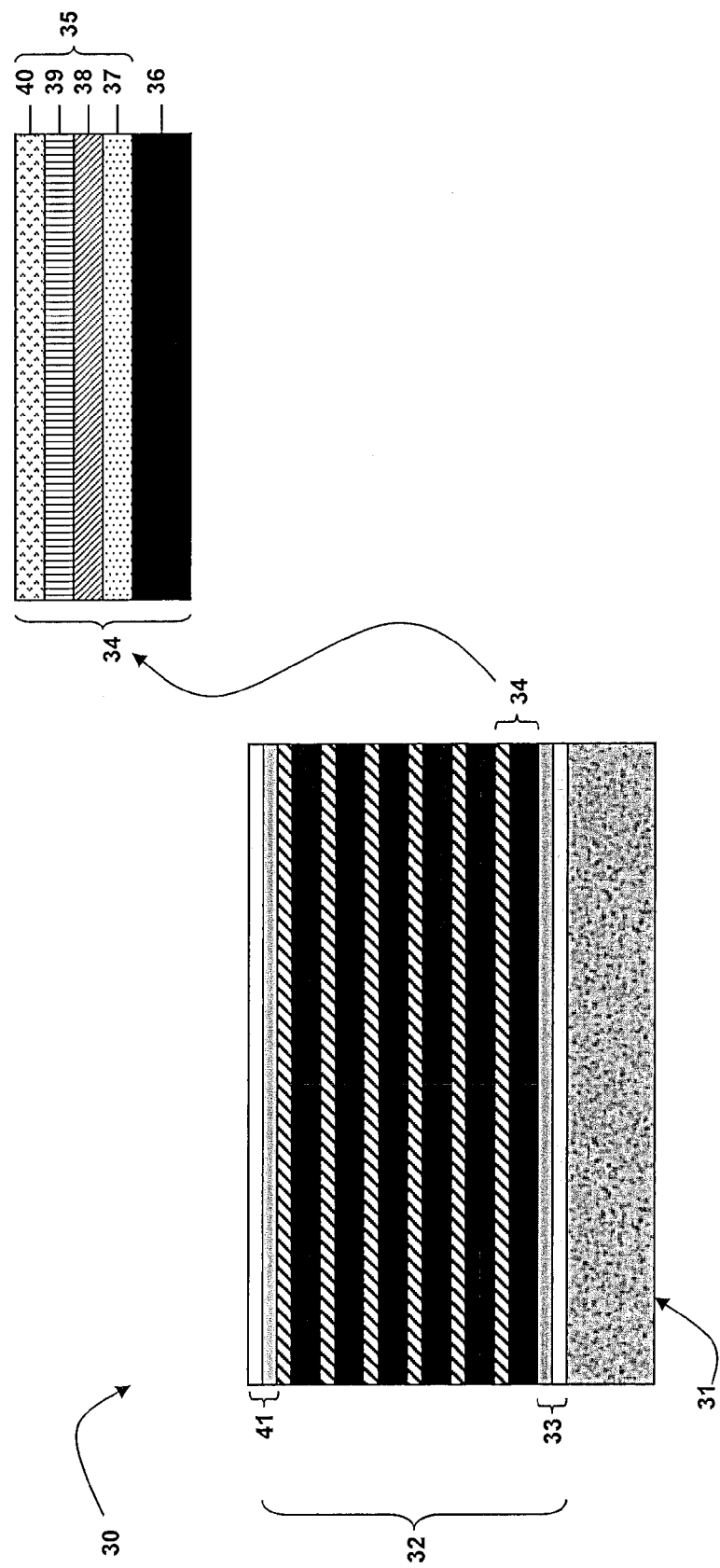
FIG. 3 is a schematic of a coated cutting tool according to one embodiment described herein.

FIG. 3 is a schematic of a coated cutting tool according to another embodiment described herein. As illustrated in FIG. 3, the coated cutting tool (30) comprises a substrate (31) and a coating (32) deposited by CVD adhered to the substrate. The CVD coating (32) comprises base layer construction (33) of TiN and TiCN. In some embodiments, the base layer construction (33) comprises TiN—TiCN/TiOCN. Further, a transition layer (not shown) can be positioned between the base layer and alumina layer of a structural unit. In some embodiments, such a transition layer comprises TiAlOC. Structural units (34) each comprising a bonding layer (35) and alumina layer (36) are deposited over the base layer construction (33). The bonding layer (35) comprises sublayers of TiAlOC (37), TiCN (38) and TiOCN (39). In the embodiment of FIG. 3, the bonding layer (35) further comprises a transition layer (40) on which the alumina layer of the next structural unit is deposited. The transition layer (40), in some embodiments, is TiAlOC. An outer layer (41) of TiCN/TiN or TiCN/TiOCN is deposited over the repeating structural units (34).

In some embodiments, a CVD coating described herein can have an architecture selected from Table IV.

TABLE IV

Coating Architectures

| Base Layer Construction | Structural Unit Construction | Outer Layer Construction |
|---|---|---|
| TiN—TiCN(MT)* | [Al$_2$O$_3$—TiAlOC/TiCN]$_n$ | — |
| TiN—TiCN(MT) | [Al$_2$O$_3$—TiAlOC/TiCN]$_n$ | TiN |
| TiN—TiCN(MT) | [Al$_2$O$_3$—TiAlOC/TiCN]$_n$ | TiOCN |
| TiN—TiCN(MT) | [Al$_2$O$_3$—TiAlOC/TiCN]$_n$ | TiCN |
| TiN—TiCN(MT) | [Al$_2$O$_3$—TiAlOC/TiCN]$_n$ | TiCN/TiOCN |
| TiN—TiCN(MT)-TiCN(HT)** | [Al$_2$O$_3$—TiAlOC/TiCN]$_n$ | — |
| TiN—TiCN(MT)-TiCN(HT) | [Al$_2$O$_3$—TiAlOC/TiCN]$_n$ | TiN |
| TiN—TiCN(MT)-TiCN(HT) | [Al$_2$O$_3$—TiAlOC/TiCN]$_n$ | TiOCN |
| TiN—TiCN(MT)-TiCN(HT)/TiOCN | [Al$_2$O$_3$—TiAlOC/TiCN]$_n$ | — |
| TiN—TiCN(MT)-TiCN(HT)/TiOCN | [Al$_2$O$_3$—TiAlOC/TiCN]$_n$ | TiN |
| TiN—TiCN(MT)-TiCN(HT)/TiOCN | [Al$_2$O$_3$—TiAlOC/TiCN]$_n$ | TiOCN |
| TiCN(MT) | [Al$_2$O$_3$—TiAlOC/TiCN]$_n$ | — |
| TiCN(MT) | [Al$_2$O$_3$—TiAlOC/TiCN]$_n$ | TiN |
| TiCN(MT) | [Al$_2$O$_3$—TiAlOC/TiCN]$_n$ | TiOCN |
| TiCN(HT) | [Al$_2$O$_3$—TiAlOC/TiCN]$_n$ | — |
| TiCN(HT) | [Al$_2$O$_3$—TiAlOC/TiCN]$_n$ | TiN |
| TiCN(HT) | [Al$_2$O$_3$—TiAlOC/TiCN]$_n$ | TiOCN |
| TiCN(MT)-TiCN(HT) | [Al$_2$O$_3$—TiAlOC/TiCN]$_n$ | — |
| TiCN(MT)-TiCN(HT) | [Al$_2$O$_3$—TiAlOC/TiCN]$_n$ | TiN |
| TiCN(MT)-TiCN(HT) | [Al$_2$O$_3$—TiAlOC/TiCN]$_n$ | TiOCN |
| TiCN(MT)-TiCN(HT)/TiOCN | [Al$_2$O$_3$—TiAlOC/TiCN]$_n$ | — |
| TiCN(MT)-TiCN(HT)/TiOCN | [Al$_2$O$_3$—TiAlOC/TiCN]$_n$ | TiN |
| TiCN(MT)-TiCN(HT)/TiOCN | [Al$_2$O$_3$—TiAlOC/TiCN]$_n$ | TiOCN |
| TiCN(HT)/TiOCN | [Al$_2$O$_3$—TiAlOC/TiCN]$_n$ | — |
| TiCN(HT)/TiOCN | [Al$_2$O$_3$—TiAlOC/TiCN]$_n$ | TiN |
| TiCN(HT)/TiOCN | [Al$_2$O$_3$—TiAlOC/TiCN]$_n$ | TiOCN |
| — | [Al$_2$O$_3$—TiAlOC/TiCN]$_n$ | — |
| — | [Al$_2$O$_3$—TiAlOC/TiCN]$_n$ | TiN |
| TiN—TiCN(MT) | [Al$_2$O$_3$—TiAlOC/TiCN/TiOCN]$_n$ | — |
| TiN—TiCN(MT) | [Al$_2$O$_3$—TiAlOC/TiCN/TiOCN]$_n$ | TiN |
| TiN—TiCN(MT) | [Al$_2$O$_3$—TiAlOC/TiCN/TiOCN]$_n$ | TiCN/TiN |
| TiN—TiCN(MT)-TiCN(HT) | [Al$_2$O$_3$—TiAlOC/TiCN/TiOCN]$_n$ | — |
| TiN—TiCN(MT)-TiCN(HT) | [Al$_2$O$_3$—TiAlOC/TiCN/TiOCN]$_n$ | TiN |
| TiN—TiCN(MT)-TiCN(HT) | [Al$_2$O$_3$—TiAlOC/TiCN/TiOCN]$_n$ | TiCN/TiN |
| TiN—TiCN(MT)-TiCN(HT)/TiOCN | [Al$_2$O$_3$—TiAlOC/TiCN/TiOCN]$_n$ | — |
| TiN—TiCN(MT)-TiCN(HT)/TiOCN | [Al$_2$O$_3$—TiAlOC/TiCN/TiOCN]$_n$ | TiN |
| TiN—TiCN(MT)-TiCN(HT)/TiOCN | [Al$_2$O$_3$—TiAlOC/TiCN/TiOCN]$_n$ | TiCN/TiN |
| TiCN(MT) | [Al$_2$O$_3$—TiAlOC/TiCN/TiOCN]$_n$ | — |
| TiCN(MT) | [Al$_2$O$_3$—TiAlOC/TiCN/TiOCN]$_n$ | TiN |
| TiCN(MT) | [Al$_2$O$_3$—TiAlOC/TiCN/TiOCN]$_n$ | TiCN/TiN |
| TiCN(HT) | [Al$_2$O$_3$—TiAlOC/TiCN/TiOCN]$_n$ | — |
| TiCN(HT) | [Al$_2$O$_3$—TiAlOC/TiCN/TiOCN]$_n$ | TiN |
| TiCN(HT) | [Al$_2$O$_3$—TiAlOC/TiCN/TiOCN]$_n$ | TiCN/TiN |
| TiCN(MT)-TiCN(HT) | [Al$_2$O$_3$—TiAlOC/TiCN/TiOCN]$_n$ | — |
| TiCN(MT)-TiCN(HT) | [Al$_2$O$_3$—TiAlOC/TiCN/TiOCN]$_n$ | TiN |
| TiCN(MT)-TiCN(HT) | [Al$_2$O$_3$—TiAlOC/TiCN/TiOCN]$_n$ | TiCN/TiN |

TABLE IV-continued

Coating Architectures

| Base Layer Construction | Structural Unit Construction | Outer Layer Construction |
|---|---|---|
| TiCN(MT)-TiCN(HT)/TiOCN | [Al$_2$O$_3$—TiAlOC/TiCN/TiOCN]$_n$ | — |
| TiCN(MT)-TiCN(HT)/TiOCN | [Al$_2$O$_3$—TiAlOC/TiCN/TiOCN]$_n$ | TiN |
| TiCN(MT)-TiCN(HT)/TiOCN | [Al$_2$O$_3$—TiAlOC/TiCN/TiOCN]$_n$ | TiCN/TiN |
| TiCN(HT)/TiOCN | [Al$_2$O$_3$—TiAlOC/TiCN/TiOCN]$_n$ | — |
| TiCN(HT)/TiOCN | [Al$_2$O$_3$—TiAlOC/TiCN/TiOCN]$_n$ | TiN |
| TiCN(HT)/TiOCN | [Al$_2$O$_3$—TiAlOC/TiCN/TiOCN]$_n$ | TiCN/TiN |
| — | [Al$_2$O$_3$—TiAlOC/TiCN/TiOCN]$_n$ | — |
| — | [Al$_2$O$_3$—TiAlOC/TiCN/TiOCN]$_n$ | TiN |
| — | [Al$_2$O$_3$—TiAlOC/TiCN/TiOCN]$_n$ | TiCN/TiN |
| TiN—TiCN(MT) | [Al$_2$O$_3$—TiAlOC/TiCN/TiOCN/TiAlOC]$_n$ | — |
| TiN—TiCN(MT) | [Al$_2$O$_3$—TiAlOC/TiCN/TiOCN/TiAlOC]$_n$ | TiN |
| TiN—TiCN(MT) | [Al$_2$O$_3$—TiAlOC/TiCN/TiOCN/TiAlOC]$_n$ | TiCN/TiN |
| TiN—TiCN(MT) | [Al$_2$O$_3$—TiAlOC/TiCN/TiOCN/TiAlOC]$_n$ | TiCN/TiOCN |
| TiN—TiCN(MT)-TiCN(HT) | [Al$_2$O$_3$—TiAlOC/TiCN/TiOCN/TiAlOC]$_n$ | — |
| TiN—TiCN(MT)-TiCN(HT) | [Al$_2$O$_3$—TiAlOC/TiCN/TiOCN/TiAlOC]$_n$ | TiN |
| TiN—TiCN(MT)-TiCN(HT) | [Al$_2$O$_3$—TiAlOC/TiCN/TiOCN/TiAlOC]$_n$ | TiCN/TiN |
| TiN—TiCN(MT)-TiCN(HT) | [Al$_2$O$_3$—TiAlOC/TiCN/TiOCN/TiAlOC]$_n$ | TiCN/TiOCN |
| TiN—TiCN(MT)-TiCN(HT)/TiOCN | [Al$_2$O$_3$—TiAlOC/TiCN/TiOCN/TiAlOC]$_n$ | — |
| TiN—TiCN(MT)-TiCN(HT)/TiOCN | [Al$_2$O$_3$—TiAlOC/TiCN/TiOCN/TiAlOC]$_n$ | TiN |
| TiN—TiCN(MT)-TiCN(HT)/TiOCN | [Al$_2$O$_3$—TiAlOC/TiCN/TiOCN/TiAlOC]$_n$ | TiCN/TiN |
| TiN—TiCN(MT)-TiCN(HT)/TiOCN | [Al$_2$O$_3$—TiAlOC/TiCN/TiOCN/TiAlOC]$_n$ | TiCN/TiOCN |
| TiCN(MT) | [Al$_2$O$_3$—TiAlOC/TiCN/TiOCN/TiAlOC]$_n$ | — |
| TiCN(MT) | [Al$_2$O$_3$—TiAlOC/TiCN/TiOCN/TiAlOC]$_n$ | TiN |
| TiCN(MT) | [Al$_2$O$_3$—TiAlOC/TiCN/TiOCN/TiAlOC]$_n$ | TiCN/TiN |
| TiCN(MT) | [Al$_2$O$_3$—TiAlOC/TiCN/TiOCN/TiAlOC]$_n$ | TiCN/TiOCN |
| TiCN(HT) | [Al$_2$O$_3$—TiAlOC/TiCN/TiOCN/TiAlOC]$_n$ | — |
| TiCN(HT) | [Al$_2$O$_3$—TiAlOC/TiCN/TiOCN/TiAlOC]$_n$ | TiN |
| TiCN(HT) | [Al$_2$O$_3$—TiAlOC/TiCN/TiOCN/TiAlOC]$_n$ | TiCN/TiN |
| TiCN(HT) | [Al$_2$O$_3$—TiAlOC/TiCN/TiOCN/TiAlOC]$_n$ | TiCN/TiOCN |
| TiCN(MT)-TiCN(HT) | [Al$_2$O$_3$—TiAlOC/TiCN/TiOCN/TiAlOC]$_n$ | — |
| TiCN(MT)-TiCN(HT) | [Al$_2$O$_3$—TiAlOC/TiCN/TiOCN/TiAlOC]$_n$ | TiN |
| TiCN(MT)-TiCN(HT) | [Al$_2$O$_3$—TiAlOC/TiCN/TiOCN/TiAlOC]$_n$ | TiCN/TiN |
| TiCN(MT)-TiCN(HT) | [Al$_2$O$_3$—TiAlOC/TiCN/TiOCN/TiAlOC]$_n$ | TiCN/TiOCN |
| TiCN(MT)-TiCN(HT)/TiOCN | [Al$_2$O$_3$—TiAlOC/TiCN/TiOCN/TiAlOC]$_n$ | — |
| TiCN(MT)-TiCN(HT)/TiOCN | [Al$_2$O$_3$—TiAlOC/TiCN/TiOCN/TiAlOC]$_n$ | TiN |
| TiCN(MT)-TiCN(HT)/TiOCN | [Al$_2$O$_3$—TiAlOC/TiCN/TiOCN/TiAlOC]$_n$ | TiCN/TiN |
| TiCN(MT)-TiCN(HT)/TiOCN | [Al$_2$O$_3$—TiAlOC/TiCN/TiOCN/TiAlOC]$_n$ | TiCN/TiOCN |
| TiCN(HT)/TiOCN | [Al$_2$O$_3$—TiAlOC/TiCN/TiOCN/TiAlOC]$_n$ | — |
| TiCN(HT)/TiOCN | [Al$_2$O$_3$—TiAlOC/TiCN/TiOCN/TiAlOC]$_n$ | TiN |
| TiCN(HT)/TiOCN | [Al$_2$O$_3$—TiAlOC/TiCN/TiOCN/TiAlOC]$_n$ | TiCN/TiN |
| TiCN(HT)/TiOCN | [Al$_2$O$_3$—TiAlOC/TiCN/TiOCN/TiAlOC]$_n$ | TiCN/TiOCN |
| — | [Al$_2$O$_3$—TiAlOC/TiCN/TiOCN/TiAlOC]$_n$ | — |
| — | [Al$_2$O$_3$—TiAlOC/TiCN/TiOCN/TiAlOC]$_n$ | TiN |
| — | [Al$_2$O$_3$—TiAlOC/TiCN/TiOCN/TiAlOC]$_n$ | TiCN/TiN |
| — | [Al$_2$O$_3$—TiAlOC/TiCN/TiOCN/TiAlOC]$_n$ | TiCN/TiOCN |

*Medium Temperature (MT)
**High Temperature (HT)
n = repeating

Coatings of cutting tools described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 μm and about 100 μm.

Blasting parameters include pressure, angle of impingement, distance to the part surface and duration. In some embodiments, angle of impingement can range from about 45 degrees to about 90 degrees, i.e., the particles impinge the coating surface at an angle ranging from about 45 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table V.

TABLE V

| Post-Coat Surface Roughness ($R_a$) Coating Surface Roughness ($R_a$) - nm |
| --- |
| ≤500 |
| ≤250 |
| <200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN. Alternatively, a post-coat treatment can remove or partially remove one or more outer layers, such as TiN, TiCN and TiOCN.

II. Methods of Making Coated Cutting Tools

Methods of making coated cutting tools are also provided. A method of making a coated cutting tool described herein comprises providing a cutting tool substrate and depositing over a surface of the cutting tool substrate by chemical vapor deposition a coating having a multilayer structure including a plurality of structural units each comprising a bonding layer and an adjacent alumina layer, the alumina layer having a thickness less than 0.5 μm and the bonding layer having a thickness less than 1 μm, the bonding layer comprising TiCN and TiAlOC. In some embodiments, the bonding layer further comprises TiOCN.

Turning now to specific steps, a method described herein comprises providing a substrate. A substrate can comprise any substrate recited in Section I hereinabove. In some embodiments, for example, a substrate is cemented carbide, such as cemented tungsten carbide, or PcBN as described in Section I. Moreover, coatings deposited according to a methods described herein can have any construction and/or properties recited in Section I. For example, deposited coatings can have a construction selected from Table IV above.

In a method described herein, bonding layers of coating structural units comprise TiCN and TiAlOC. In some embodiments, the bonding layers further comprise TiOCN. TiCN, TiOCN and TiAlOC sublayers of a bonding layer can be deposited according to the general CVD parameters provided in Table VI.

TABLE VI

CVD Parameters for bonding layer deposition

| Bonding Sublayer Composition | Gas Mixture | Temperature (° C.) | Pressure (torr) | Duration (minutes) |
| --- | --- | --- | --- | --- |
| TiCN | $H_2$, $N_2$, $TiCl_4$, $CH_4$ | 800-1000 | 60-300 | 2-20 |
| TiOCN | $H_2$, $N_2$, $TiCl_4$, $CH_4$, CO, HCl | 800-1000 | 60-500 | 2-20 |
| TiAlOC | $TiCl_4$, $AlCl_3$, $N_2$, $CH_4$, $H_2$, HCl, CO | 800-1000 | 60-300 | 2-20 |

Further, alumina layers of structural units of the coating can be deposited according to the general CVD parameters provided in Table VII.

TABLE VII

CVD Parameters for alumina deposition

| Gas Mixture | Temperature (° C.) | Pressure (torr) | Duration (minutes) |
| --- | --- | --- | --- |
| $AlCl_3$, $H_2$, $CO_2$, $H_2S$*, HCl* | 900-1050 | 30-100 | 3-45 |

*Optional

A structural unit can be deposited directly on the surface of the cutting tool substrate without the presence of any base layers. However, in some embodiments, one or more base layers of the coating reside between the substrate and structural units. A base layer can comprise one or more metallic elements selected from the group consisting of aluminum and metallic elements of Groups IVB, VB and VIB of the Periodic Table and one or more non-metallic elements of Groups IIIA, IVA, VA and VIA of the Periodic Table. A base layer, for example, can be selected from the group consisting of titanium nitride (TiN), titanium carbonitride (TiCN) and titanium oxycarbonitride (TiOCN). In some embodiments, a multilayer arrangement is present comprising TiN and TiCN. General CVD deposition parameters for various base layers are provided in Table VIII.

TABLE VIII

CVD Parameters for base layer deposition

| Base Layer Composition | Gas Mixture | Temperature (° C.) | Pressure (torr) | Duration (minutes) |
| --- | --- | --- | --- | --- |
| TiN | $H_2$, $N_2$, $TiCl_4$ | 800-900 | 60-300 | 20-60 |
| TiCN(MT) | $H_2$, $N_2$, $TiCl_4$, $CH_3CN$ | 750-900 | 30-120 | 60-300 |
| TiCN(HT) | $H_2$, $N_2$, $TiCl_4$, $CH_4$ | 900-1050 | 30-300 | 30-100 |
| TiOCN | $H_2$, $N_2$, $TiCl_4$, $CH_4$, CO | 900-1050 | 60-500 | 30-100 |

Additionally, methods described herein can further comprise depositing one or more outer layers over the structural units. An outer layer, in some embodiments, comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In one embodiment, for example, an outer layer of TiCN and/or TiOCN is deposited with reference to CVD parameters set forth in Table VIII. Coatings deposited according to methods described herein can have an architecture provided in Table IV above.

Further, the deposited coatings can be subjected to post-coat treatment(s) such as post-coat blasting or polishing as described in Section I hereinabove. Post coat blasting, in some embodiments, can change moderate tensile stress of the coating to moderate compressive stress or increase compressive stress in the as-deposited coating.

These and other embodiments are further illustrated in the following non-limiting examples.

Example 1

Coated Cutting Tool

A coated cutting tool described herein was produced by placing a cemented tungsten carbide (WC—Co) cutting insert substrate [ANSI standard geometry CNMA432] into an axial flow hot-wall CVD reactor. The cutting insert comprised about 6 wt. % cobalt binder with the balance WC grains of size 1 to 5 µm. A coating having an architecture provided in Table IX was deposited on the cemented WC cutting insert according to the CVD process parameters provided in Tables VI-VIII.

TABLE IX

CVD Coating Architecture

| Substrate | CVD Coating Architecture |
|---|---|
| WC—Co | TiN*—TiCN(MT)-[$Al_2O_3$—TiAlOC/ TiCN/TiOCN]$_n$—TiCN/TiOCN |

*Innermost layer adjacent to the substrate
n = 16

The resulting multilayered coating demonstrated the properties provided in Table X.

TABLE X

Properties of CVD Coating

| Coating Layers | Thickness (µm) |
|---|---|
| TiN | 0.5 |
| TiCN(MT) | 8.0 |
| [$Al_2O_3$—TiAlOC/TiCN/TiOCN]$_{16}$ | 8.5 |
| TiCN/TiOCN | 1.5 |

Figure 4:
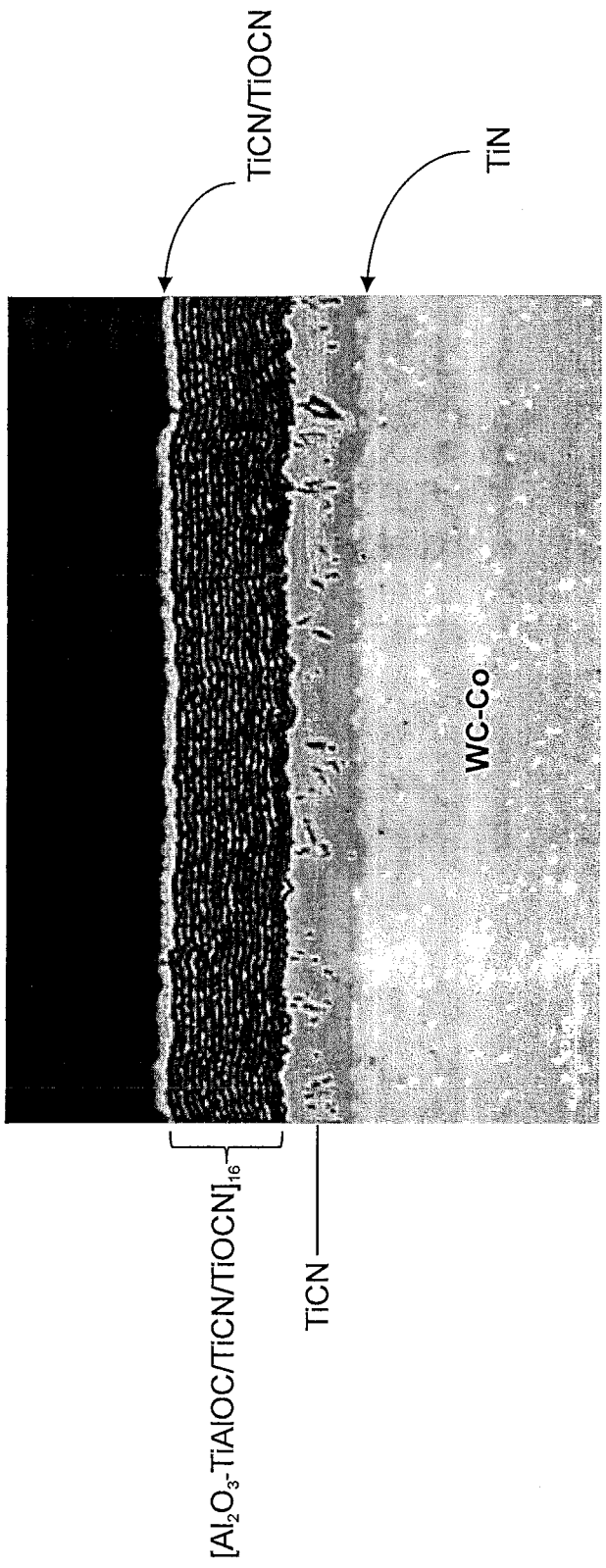
FIG. 4 is a cross-sectional optical image of a coated cutting insert according to one embodiment described herein.

Alumina layers of the repeating structural units displayed individual thicknesses of less than 0.5 µm. FIG. 4 is a cross-sectional optical image of the coated cutting insert of this Example 1 demonstrating layers of the coating architecture.

Example 2

Coated Cutting Tool

A coated cutting tool described herein was produced by placing a cemented tungsten carbide (WC—Co) cutting insert substrate [ANSI standard geometry CNMA432] into an axial flow hot-wall CVD reactor. The cutting insert comprised about 6 wt. % cobalt binder with the balance WC grains of size 1 to 5 µm. A coating having an architecture provided in Table XI was deposited on the cemented WC cutting insert according to the CVD process parameters provided in Tables VI-VIII.

TABLE XI

CVD Coating Architecture

| Substrate | CVD Coating Architecture |
|---|---|
| WC—Co | TiN*—TiCN(MT)-[$Al_2O_3$—TiAlOC/ TiCN/TiOCN]$_n$—TiCN/TiOCN |

*Innermost layer adjacent to the substrate
n = 32

The resulting multilayered coating demonstrated the properties provided in Table XII.

TABLE XII

Properties of CVD Coating

| Coating Layers | Thickness (µm) |
|---|---|
| TiN | 0.5 |
| TiCN(MT) | 8.0 |
| [$Al_2O_3$—TiAlOC/TiCN/TiOCN]$_{32}$ | 10.5 |
| TiCN/TiOCN | 1.5 |

Figure 5:
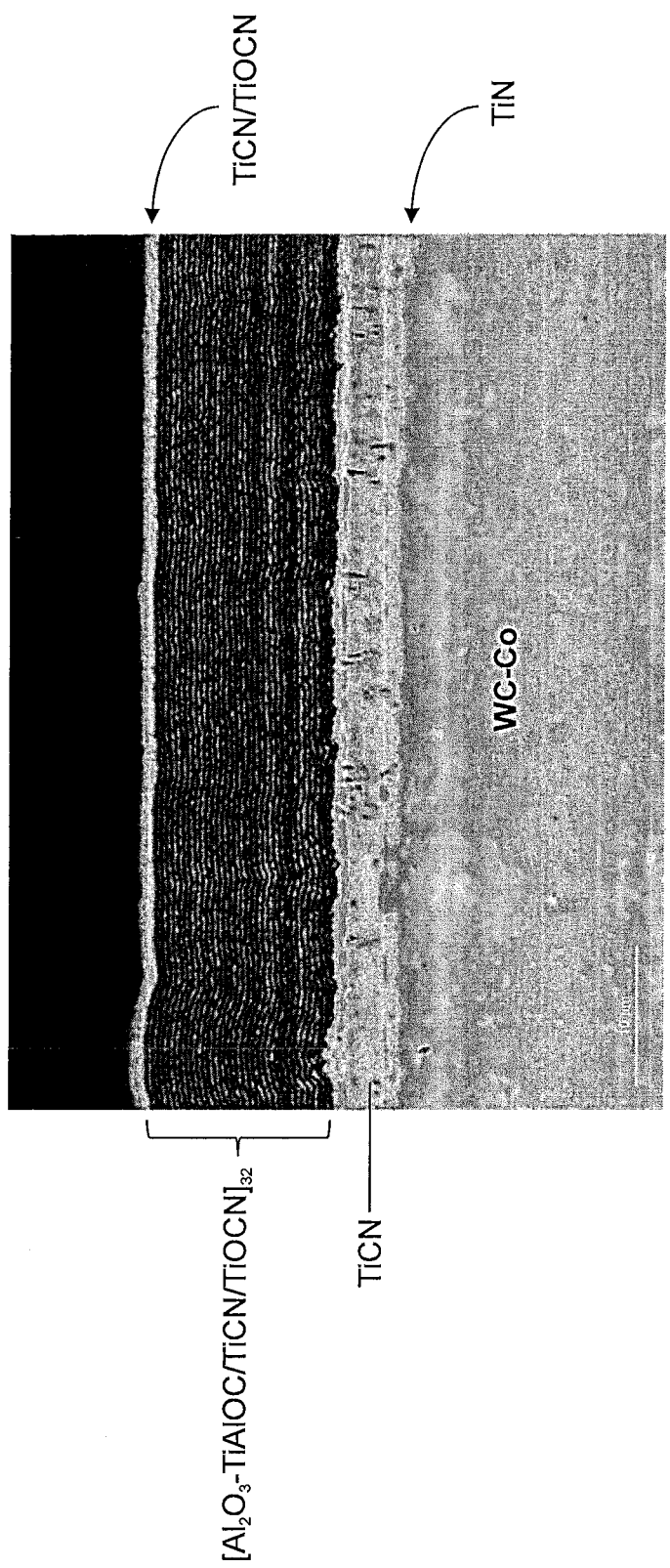
FIG. 5 is a cross-sectional optical image of a coated cutting insert according to one embodiment described herein.

Alumina layers of the repeating structural units displayed individual thicknesses of less than 0.1 µm. FIG. 5 is a cross-sectional optical image of the coated cutting insert of this Example 2 demonstrating layers of the coating architecture.

Example 3

Metal Cutting Testing

Coated cutting inserts (1-3) having the structure of Example 2 and Comparative coating insert (4) were subjected to continuous turning testing according to the parameters below. Comparative cutting insert (4) employed a WC—Co substrate of substantially similar composition as Example 2 and an ANSI standard geometry CNMA432. Further, Comparative cutting insert (4) displayed a coating architecture and properties as set forth in Table XIII.

TABLE XIII

Comparative cutting insert 4

| Coating Layers | Thickness (µm) |
|---|---|
| TiN* | 0.5 |
| TiCN(MT) | 10.0 |
| TiCN(HT)/TiOCN/TiAlOC | 1.0 |
| α-$Al_2O_3$ | 9.2 |
| TiCN/TiN | 1.5 |

*Coating Layer adjacent to WC—Co Substrate

Coated cutting inserts (1-3) of Example 2 and Comparative coated insert (4) were post-coat treated according to Table XIV.

TABLE XIV

Post-coat treatment

| Coated Cutting Insert | Post-coat treatment |
|---|---|
| 1 | None |
| 2 | Polish - 5-10 µm diamond grit paste |
| 3 | Wet Blast - alumina particle slurry |
| 4 | None |

Coated cutting inserts (1-3) of Example 2 and Comparative coating insert (4) were subjected to continuous turning testing as follows:
Workpiece—G2 Cl
Speed—1300 sfm (396 m/min)
Feed Rate—0.012 ipr (0.3048 mm/min)
Depth of Cut—0.08 inch (0.08 mm)
Lead Angle: −5°
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) 0f 0.012 inches
Trailing Edge Wear (TW) of 0.012 inches Three cutting inserts were tested for each coating architecture (1-4) providing repetition 1-3 data as well as mean cutting lifetime. The results of the continuous turning testing are provided in Table XV.

TABLE XV

Continuous Turning Testing Results

| Coated Cutting Insert | Repetition 1 Lifetime (minutes) | Repetition 2 Lifetime (minutes) | Repetition 2 Lifetime (minutes) | Mean Cutting Lifetime (minutes) |
|---|---|---|---|---|
| 1 | 10.1 | 11.8 | 11.7 | 11.2 |
| 2 | 12.1 | 12.0 | 10.4 | 11.5 |
| 3 | 12.9 | 11.1 | 10.0 | 11.3 |
| 4* | 5.9 | 5.4 | 5.7 | 5.7 |

*Comparative Insert

As provided in Table XV, coated cutting inserts 1-3 having the architecture of Example 2 demonstrated significantly increased cutting lifetimes relative to Comparative cutting insert 4.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
   a substrate; and
   a coating adhered to the substrate, the coating having a multilayer structure including a plurality of structural units each comprising a bonding layer and an adjacent alumina layer, the alumina layer having a thickness of less than 0.5 µm and the bonding layer having a thickness less than 1 µm, the bonding layer comprising TiCN and TiAlOC.

2. The coated cutting tool of claim 1, wherein the bonding layer further comprises TiOCN.

3. The coated cutting tool of claim 2, wherein the TiCN, TiOCN and TiAlOC are sublayers of the bonding layer.

4. The coated cutting tool of claim 3, wherein the sublayers of TiCN, TiOCN and TiAlOC have individual thicknesses of 0.010 µm to 0.5 µm.

5. The coated cutting tool of claim 3, wherein TiAlOC sublayers contact alumina layers sandwiching the bonding layer.

6. The coated cutting tool of claim 3, wherein the TiCN sublayer is sandwiched by the TiOCN and TiAlOC sublayers.

7. The coated cutting tool of claim 1, wherein the bonding layer has a thickness less than 0.5 µm.

8. The coated cutting tool of claim 1, wherein the TiCN and TiAlOC are sublayers of the bonding layer.

9. The coated cutting tool of claim 8, wherein TiAlOC sublayers contact alumina layers sandwiching the bonding layer.

10. The coated cutting tool of claim 1, wherein the structural units are adjacent to one another forming a structure of alternating alumina and bonding layers.

11. The coated cutting tool of claim 1, wherein at least two of the structural units are spaced apart by one or more intervening layers.

12. The coated cutting tool of claim 11, wherein an intervening layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

13. The coated cutting tool of claim 1, wherein the coating further comprises a base layer adjacent to the substrate surface.

14. The coated cutting tool of claim 13, wherein the base layer comprises at least one of TiN, TiCN and TiOCN.

15. The coated cutting tool of claim 1, wherein the alumina layer has a thickness of 0.01-0.1 µm.

16. The coated cutting tool of claim 1, wherein the coating is deposited by chemical vapor deposition.

17. The coated cutting tool of claim 1, wherein the coating further comprises an outermost layer comprising one or more metallic elements selected from the group consisting of aluminum and metallic elements of Groups IVB, VB and VIB of the Periodic Table and one or more non-metallic elements of Groups IIIA, IVA, VA and VIA of the Periodic Table.

18. The coated cutting tool of claim 1, wherein the coating has a thickness of 1-25 µm.

19. The coated cutting tool of claim 1, wherein the coating has a thickness of 5-15 µm.

20. The coating cutting tool of claim 1, wherein the substrate is formed of cemented carbide, carbide, ceramic or steel.

* * * * *